(12) United States Patent
Cho

(10) Patent No.: US 12,166,055 B2
(45) Date of Patent: Dec. 10, 2024

(54) IMAGE SENSING DEVICE

(71) Applicant: SK hynix Inc., Icheon-si (KR)

(72) Inventor: Sung Wook Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 468 days.

(21) Appl. No.: 17/522,615

(22) Filed: Nov. 9, 2021

(65) Prior Publication Data
US 2022/0293659 A1    Sep. 15, 2022

(30) Foreign Application Priority Data

Mar. 15, 2021    (KR) ........................ 10-2021-0033101

(51) Int. Cl.
| | | |
|---|---|---|
| *H01L 27/14* | (2006.01) | |
| *H01L 27/146* | (2006.01) | |
| *H04N 25/50* | (2023.01) | |
| *H04N 25/62* | (2023.01) | |
| *H04N 25/704* | (2023.01) | |

(52) U.S. Cl.
CPC .... *H01L 27/14627* (2013.01); *H01L 27/1462* (2013.01); *H01L 27/14621* (2013.01); *H01L 27/1463* (2013.01); *H01L 27/14645* (2013.01); *H04N 25/50* (2023.01); *H04N 25/62* (2023.01); *H04N 25/704* (2023.01)

(58) Field of Classification Search
CPC .......... H01L 27/1462; H01L 27/14621; H01L 27/14627; H01L 27/1463; H01L 27/14645; H04N 25/50; H04N 25/62; H04N 25/704
See application file for complete search history.

(56) References Cited

U.S. PATENT DOCUMENTS

| | | | |
|---|---|---|---|
| 9,899,439 B2 | 2/2018 | Miyashita | |
| 9,978,786 B2 | 5/2018 | Asatsuma | |
| 2013/0015545 A1* | 1/2013 | Toumiya | ........... H01L 27/14605 257/E31.127 |
| 2016/0013226 A1 | 1/2016 | Shim et al. | |
| 2019/0281240 A1* | 9/2019 | Jung | .................... H04N 25/702 |

OTHER PUBLICATIONS

US 10,587,829 B2, 03/2020, Yokogawa (withdrawn)
First Office Action for CN Appl. 202111298254.2, mailed on Jun. 27, 2024, 19 pages with English translation.

* cited by examiner

*Primary Examiner* — Kevin K Pyo
(74) *Attorney, Agent, or Firm* — Perkins Coie LLP

(57) ABSTRACT

An image sensing device for preventing a crosstalk path is disclosed. The image sensing device includes a substrate including a plurality of photoelectric conversion elements, each of which generates and accumulates photocharges corresponding to incident light and a plurality of lenses disposed over the substrate, and arranged to receive the incident light and to direct received incident light to the plurality of photoelectric conversion elements, wherein the plurality of lenses includes a first lens and a second lens that are arranged to contact each other and have different refractive indexes from each other.

19 Claims, 9 Drawing Sheets

IMAGE SENSING DEVICE

CROSS-REFERENCE TO RELATED APPLICATION

This patent document claims the priority and benefits of Korean patent application No. 10-2021-0033101, filed on Mar. 15, 2021, which is incorporated by reference in its entirety as part of the disclosure of this patent document.

TECHNICAL FIELD

The technology and implementations disclosed in this patent document generally relate to an image sensing device, and more particularly to an image sensing device including microlenses.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device for preventing crosstalk by forming a microlens having a high refractive index in phase detection autofocus (PDAF) pixels.

In accordance with an embodiment of the disclosed technology, an image sensing device may include a substrate including a plurality of photoelectric conversion elements, each of which generates and accumulates photocharges corresponding to incident light and a plurality of lenses disposed over the substrate, and arranged to receive the incident light and to direct received incident light to the plurality of photoelectric conversion elements, wherein the plurality of lenses includes a first lens and a second lens that are arranged to contact each other and have different refractive indexes from each other.

In accordance with another embodiment of the disclosed technology, an image sensing device may include a first lens arranged to overlap with a first pixel, and configured to have a first refractive index, and a second lens arranged to overlap with a plurality of second pixels, and configured to have a second refractive index, wherein the second refractive index is higher than the first refractive index.

In accordance with another embodiment of the disclosed technology, an image sensing device may include a first pixel array disposed in an edge region of a pixel array and a second pixel array disposed in a central region of the pixel array that is surrounded by the edge region, wherein each of the first pixel array and the second pixel array includes first pixels configured to detect an image and second pixels configured to detect a phase difference between images, wherein a first lens having a first refractive index is disposed to correspond to each of the first pixels and a second lens having a second refractive index higher than the first refractive index is disposed to correspond some of the second pixels.

DETAILED DESCRIPTION

This patent document provides implementations and examples of an image sensing device including microlenses having different refractive indexes. Some implementations of the disclosed technology suggest an image sensing device which can effectively prevent crosstalk from being introduced into adjacent pixels by forming a microlens having a high refractive index in phase detection autofocus (PDAF) pixels.

Hereafter, various embodiments will be described with reference to the accompanying drawings. However, it should be understood that the present disclosure is not limited to specific embodiments but includes various modifications, equivalents and/or alternatives of the embodiments. The embodiments of the disclosed technology may provide a variety of effects capable of being directly or indirectly recognized through the present disclosure.

Figure 1:
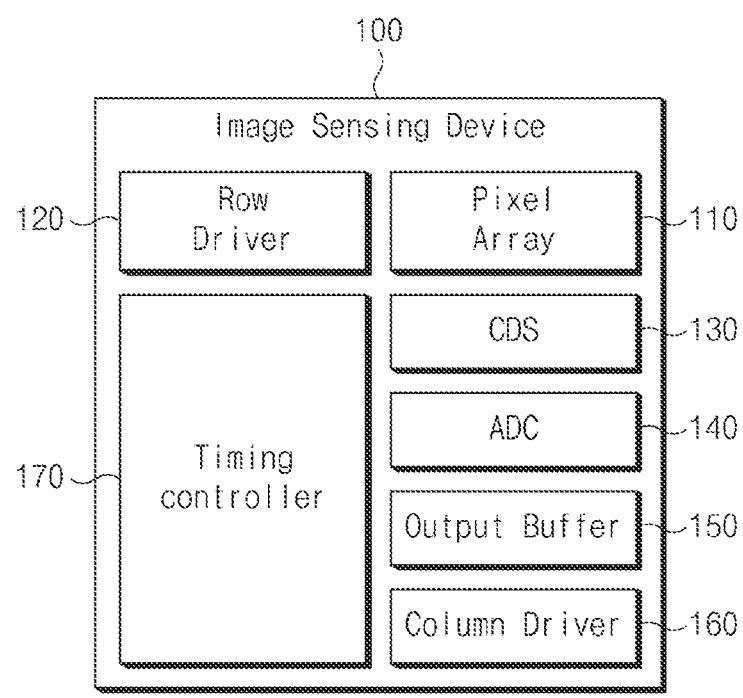
FIG. 1 is a block diagram illustrating an example of an image sensing device based on some implementations of the disclosed technology.

FIG. 1 is a block diagram illustrating an image sensing device according to an embodiment of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160 and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns. In another example, the plurality of unit imaging pixels can be arranged in a three dimensional pixel array. The plurality of unit pixels may convert an optical signal into an electrical signal on a unit pixel basis or a pixel group basis, where unit pixels in a pixel group share at least certain internal circuitry. The pixel array 110 may receive driving signals, including a row selection signal, a pixel reset signal and a transmission signal, from the row driver 120. Upon receiving the driving signal, corresponding imaging pixels in the pixel array 110 may be activated to perform the operations corresponding to the row selection signal, the pixel reset signal, and the transmission signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer for counting until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data from the selected column of the output buffer 150 as an output signal.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
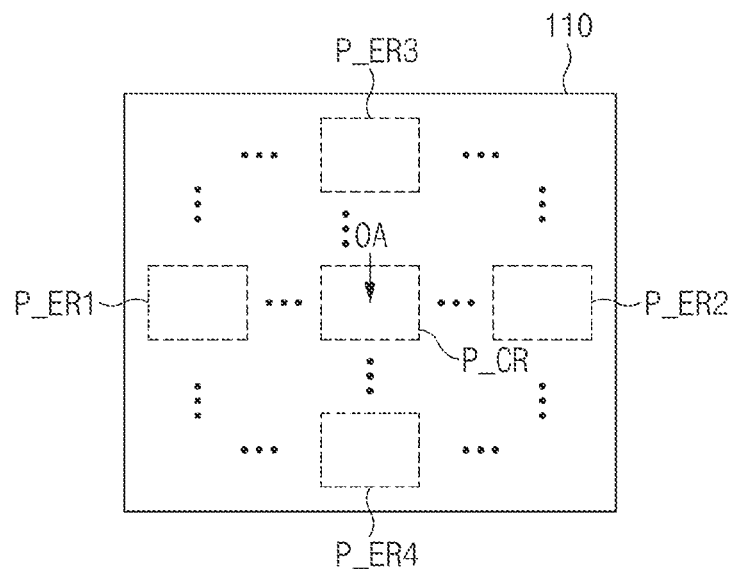
FIG. 2 is a schematic diagram illustrating an example of a pixel array shown in FIG. 1 based on some implementations of the disclosed technology.

FIG. 2 is a schematic diagram illustrating an example of the pixel array 110 shown in FIG. 1 based on some implementations of the disclosed technology.

Referring to FIG. 2, the pixel array 110 may include a plurality of unit pixel arrays P_CR, P_ER1, P_ER2, P_ER3, and P_ER4.

The unit pixel array P_CR may be disposed in a center region of the pixel array 110 based on an optical axis (OA). The optical axis (OA) may refer to an axis of light incident upon the center of a lens module (to be described later) disposed above the pixel array 110. The optical axis (OA) passes through the center region. The unit pixel array P_CR may include pixels that are arranged in a predetermined number of rows and columns.

The plurality of unit pixel arrays P_ER1~P_ER4 may be disposed in an edge region of the pixel array 110 based on the optical axis (OA). The edge region is disposed outside of the center region of the pixel array 110, in which the unit pixel array P_CR is disposed. The plurality of unit pixel arrays P_ER1~P_ER4 may be arranged to surround the unit pixel array P_CR, and may include corresponding pixels other than the pixels included in the unit pixel array P_CR.

Although FIG. 2 illustrates that the unit pixel arrays P_ER1~P_ER4 are disposed to surround the unit pixel array P_CR, other implementations are also possible. Although each of the unit pixel arrays P_CR, and P_ER1~P_ER4 shown in FIG. 2 has a rectangular shape, other implementations are also possible.

Figure 3:
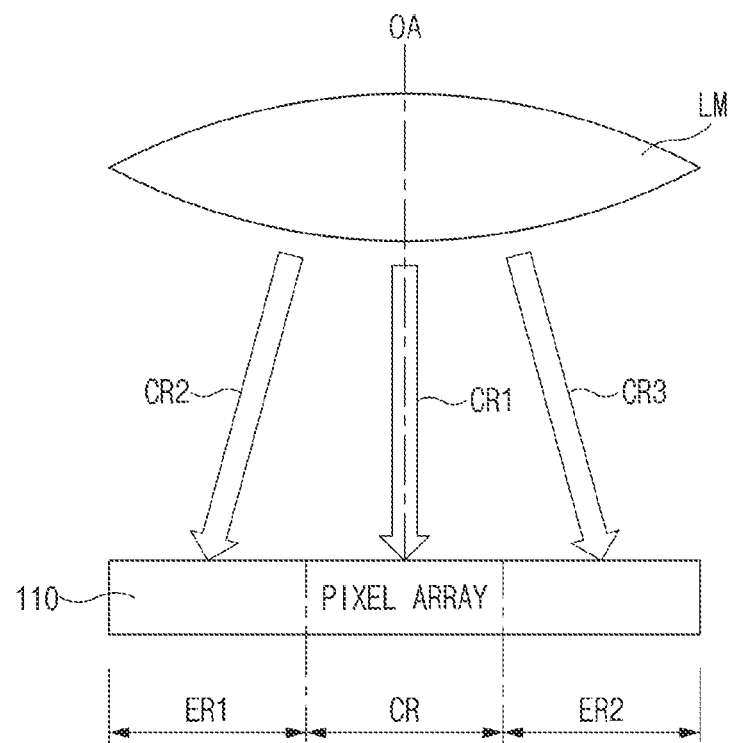
FIG. 3 is a diagram illustrating an example of light beams incident upon a pixel array shown in FIG. 2 based on some implementations of the disclosed technology.

FIG. 3 is a diagram illustrating an example of light beams incident upon the pixel array 110 shown in FIG. 2 based on some implementations of the disclosed technology.

FIG. 3 is a cross-sectional view illustrating the pixel array 110 taken along a predetermined cutting line including the optical axis (OA). The pixel array 110 may be classified into a center region CR including the optical axis (OA), a first edge region ER1 disposed at one side (e.g., the left side) of the center region CR, and a second edge region ER2 disposed at the other side (e.g., the right side) of the center region CR. The center region CR may refer to a region in which the unit pixel array P_CR shown in FIG. 2 is disposed. The first edge region ER1 may refer to a region included in the unit pixel array P_ER1 shown in FIG. 2, and the second edge region ER2 may refer to a region included in the unit pixel array P_ER2 shown in FIG. 2.

A chief ray (CR1) incident upon the center region CR through a lens module (LM) may be vertically (or in a direction close to vertical) incident upon a top surface of the pixel array 110. Thus, an incident angle of the chief ray incident upon the center region (CR) may be set to 0° (or an angle close to 0°).

A chief ray CR2 incident upon the first edge region ER1 and a chief ray CR3 incident upon the second edge region ER2 may be obliquely incident upon the top surface of the pixel array 110. Thus, an incident angle of the chief ray CR2 incident upon the first edge region ER1 may correspond to a predetermined angle (greater than 0° and less than 90°), and an incident angle of the chief ray CR3 incident upon the second edge region ER2 may correspond to a predetermined angle (greater than 0° and less than 90°). In this case, the predetermined angle may vary depending on the size of the pixel array 110, a curvature of the lens module (LM), and the distance between the lens module (LM) and the pixel array 110. In addition, the incident angle of each of the chief rays CR1 to CR3 may gradually increase in the direction from the optical axis (OA) to edges of the pixel array 110.

Figure 4:
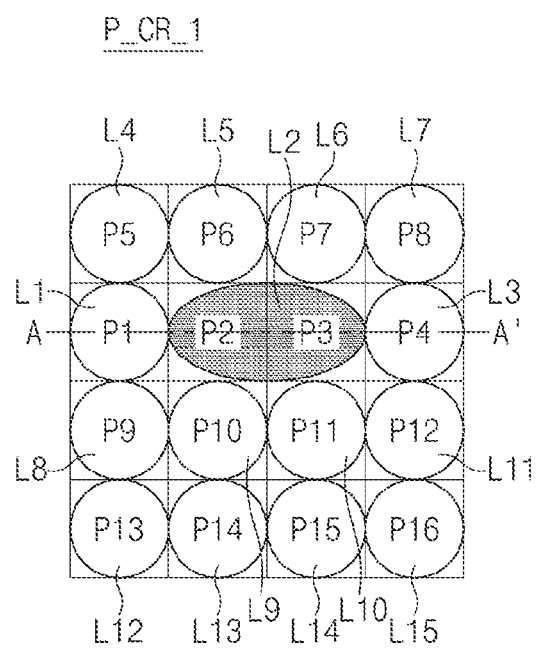
FIGS. 4 and 5 are plan views illustrating examples of a unit pixel array shown in FIG. 2 based on some implementations of the disclosed technology.
Figure 5:
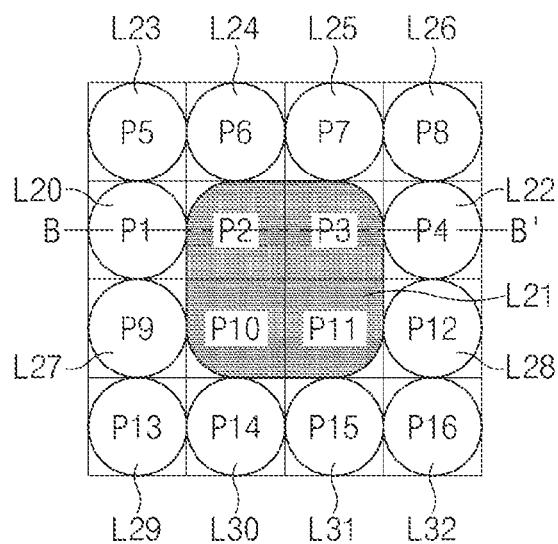

FIGS. 4 and 5 are plan views illustrating examples of the unit pixel array P_CR located at the center region CR of the pixel array 110 shown in FIG. 2 based on some implementations of the disclosed technology. Each of a unit pixel array P_CR_1 shown in FIG. 4 and a unit pixel array P_CR_2 shown in FIG. 5 may include a structure in which the pixels P1 to P16 are arranged in a (4×4) matrix array including four rows and four columns. Although each of the unit pixel arrays P_CR_1 and PCR_2 includes 16 pixels P1~P16 in FIGS. 4 and 5, other implementations are also possible. For example, 16 pixels P1 to P16 may be repeatedly arranged in each of the row and column directions of the unit pixel array P_CR_1.

In the (4×4) pixel array structure including 16 pixels P1~P16 shown in FIG. 4, two types of pixels are included, which include first pixels (P1 and P4 to P16) and second pixels (P2 and P3). The first pixels P1 and P4~P16 may be used for image detection and the second pixels P2 and P3 may be used to detect a phase difference for autofocusing. The numbers of the first pixels and the second pixels that are included in the pixel array can be modified. For example, as described later, FIG. 5 shows another example of the pixel array including 12 first pixels and 4 second pixels.

The second pixels P2 and P3 correspond to PDAF (Phase Detection Auto Focus) pixels for performing autofocusing through phase detection and are formed in a (1×2) pixel structure. The PDAF pixels P2 and P3 operate to detect a phase difference between a first image formed by the left pixel P2 and a second image formed by the right pixel P3, calculate a movement distance of a lens based on the detected phase difference, and adjust a position of the lens based on the calculation. By the autofocusing operations of the PDAF pixels P2 and P3, in-focus images can be obtained.

The lenses L1 to L15 of the unit pixel array P_CR_1 may be formed to allow incident light to be more efficiently incident upon photoelectric conversion elements (as described later). In the illustrated example, each of the first lenses L1 and L3~L15 may be disposed to overlap with the first pixels P1 and P4~P16, respectively, and each may have a lower refractive index than that of the second lens L2. The second lens L2 may be disposed to overlap with or to cover more than one pixel, e.g., adjacent second pixels P2 and P3 (i.e., two pixels P2 and P3). In such a design, the second lens L2 corresponding to or covering two or more second pixels P2 and P3 may be different in size from the first lenses L1 and L13~L15, each of which corresponds to or covers one pixel. In some implementations, the second lens L2 has a size greater than that of the first lens. The second lens L2 may include a high-refractive-index lens having a higher refractive index than each of the first lenses L1 and L3~L15.

FIG. 5 shows another example of a unit pixel array P_CR located at a center region CR of a pixel array. In a (4×4) pixel array structure including 16 pixels P1~P16 shown in FIG. 5, first pixels (e.g., 12 pixels) P1, P4~P9, and P12~P16 may be used for image detection. In the (4×4) pixel array structure including 16 pixels P1~P16, second pixels (e.g., four pixels) P2, P3, P10, and P11 disposed at the center region of the (4×4) pixel array structure may be used to detect a phase difference for autofocusing. The second pixels P2, P3, P10, and P11 may correspond to PDAF pixels for performing autofocusing through phase detection and are formed in a (2×2) pixel structure. The (2×2) pixel structure including PDAF pixels is referred to as a 4-coupled PDAF structure. The PDAF pixels with the 4-coupled PDAF structure operate to detect a phase difference between an image formed by left pixels P2 and P10 and an image formed by right pixels P3 and P11 so as to calculate a row-directional phase difference, and detect a phase difference between an image formed by upper pixels P2 and P3 and an image formed by lower pixels P10 and P11 so as to calculate a column-directional phase difference. By the autofocusing operations of the pixels with the 4-coupled PDAF structure, it is possible to more correctly perform the autofocus operation based on the row-directional phase difference and the column-directional phase difference.

The lenses L20~L32 of the unit pixel array P_CR_1 may be formed to allow incident light to be more efficiently incident upon photoelectric conversion elements (as described later). Each of the first lenses L20 and L22~L32 disposed to overlap with the first pixels P1, P4~P9, and P12~P16 may have a lower refractive index than the second lens L21. The second lens L21 may be disposed to overlap with the second pixels P2, P3, P10, and P11 (i.e., four pixels). Thus, the second lens L21 corresponding to the second pixels P2, P3, P10, and P11 may be different in size from each of the first lenses L20 and L22~L32. The second lens L21 may include a high-refractive-index lens having a higher refractive index than each of the first lenses L20 and L22~L32.

Figure 6:
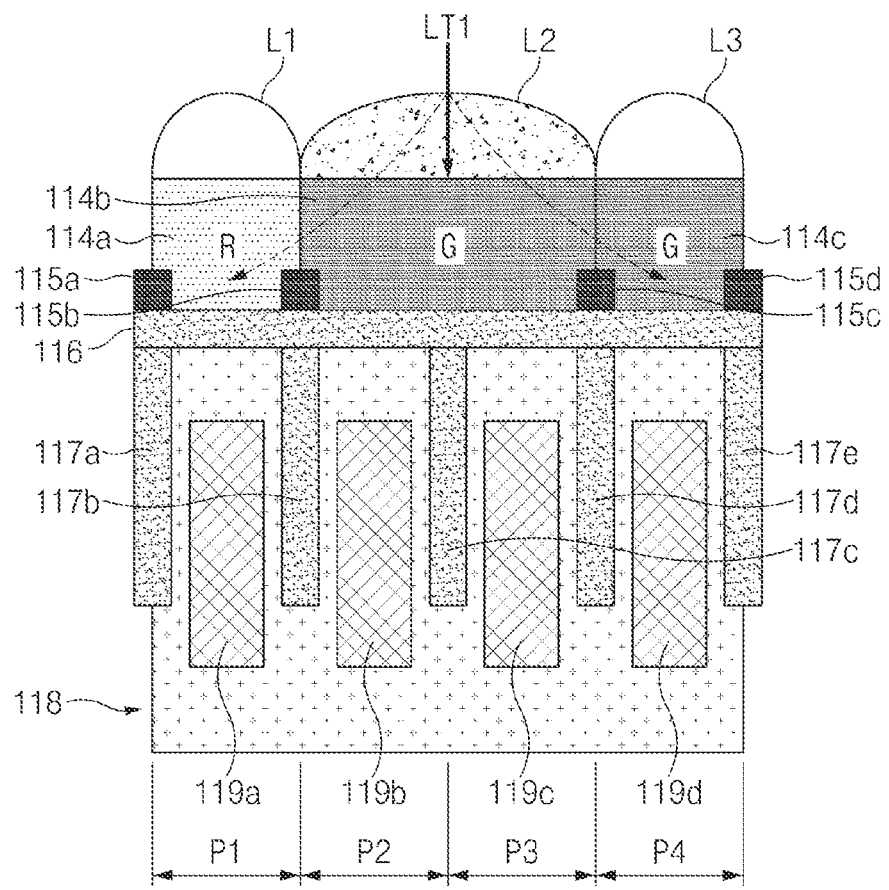
FIG. 6 is a cross-sectional view illustrating an example of a pixel array shown in FIG. 4 based on some implementations of the disclosed technology.

FIG. 6 is a cross-sectional view illustrating the unit pixel array P_CR based on some implementations of the disclosed technology. FIG. 6 shows a cross-sectional view of the unit pixel array P_CR_1 taken along the line A-A' shown in FIG. 4. The same cross-sectional view can be also obtained from the pixel array P_CR_2 by taking along the line B-B' shown in FIG. 5. The cross-sectional view of the unit pixel array P_CR_1 shown in FIG. 4 includes first pixel P1 and P4 and second pixel P2 and P3 of the unit pixel array P_CR.

The unit pixel array P_CR_1 may include the first lenses L1 and L3, the second lens L2, optical filters 114a, 114b, and 114c, optical grid structures 115a, 115b, 115c, and 115d, a planarization layer 116, device isolation layers 117a, 117b, 117c, 117d, and 117e, a substrate 118, and photoelectric conversion elements 119a, 119b, 119c, and 119d.

In some implementations, the first lenses L1 and L3 and the second lens L2 may be formed to contact each other, and each of the lenses L1, L2, and L3 may include a microlens (or on-chip lenses). The first lenses L1 and L3 and the second lens L2 may direct (or guide) incident light (LT1) to be efficiently incident upon the photoelectric conversion elements 119a~119d of the unit pixels P1~P4. The incident light (LT1) incident upon each of the pixels P1~P4 included in the center region CR may be vertically incident upon a top surface of the substrate 118. The incident light (LT1) may be incident upon the unit pixel array P_CR_1 in a direction parallel to the optical axis (OA) while passing through the center portion of the first lenses L1 and L3 and the second lens L2. Since an incident angle of the incident light (LT1) corresponds to 0° (or an angle close to 0°), the incident light (LT1) having penetrated the first lenses L1 and L3 and the second lens L2 may have a refraction angle and may be transmitted to the photoelectric conversion elements 119a~119d.

Each of the first lenses L1 and L3 and the second lens L2 may be formed in a hemispherical shape, and the first lenses L1 and L3 and the second lens L2 may be formed over the optical filters 114a~114c, respectively. The first lens L1 may be formed over the optical filter 114a, the second lens L2 may be formed over the optical filter 114b, and the first lens L3 may be formed over the optical filter 114c.

In some implementations, a coating layer (not shown) may be formed over the first lenses L1 and L3 and the second lens L2 to prevent irregular or diffused reflection of incident light received from outside, thereby suppressing flare characteristics. For example, the coating layer (or a coating film) formed of a material having a refractive index different from those of the first lenses L1 and L3 and the second lens L2 may be formed over the first lenses L1 and L3 and the second lens L2. Here, the coating layer may include an oxide material.

The first lens L1 formed at the left side of the second lens L2 may correspond to the pixel P1. The first lens L3 formed at the right side of the second lens L2 may correspond to the pixel P4. The second lens L2 corresponding to the pixels P2 and P3 formed at the center portion between the first lenses L1 and L3 may include a high-refractive-index lens having a higher refractive index. For example, assuming that each of the first lenses L1 and L3 has a first refractive index, the second lens L2 may have a second refractive index having a higher refraction index than the first refractive index.

The second lens L2 may be shared by the second pixels P2 and P3 for phase detection. For example, the photoelectric conversion element 119b included in the second pixel P2 and the photoelectric conversion element 119c included in the second pixel P3 may receive light from the same second lens L2. Thus, the second pixels P2 and P3 may be arranged adjacent to each other, and the second lens L2 may be formed to cover the second pixels P2 and P3.

The image sensing device 100 based on some implementations of the disclosed technology may allow the second lens L2 corresponding to the second pixels P2 and P3, which are PDAF pixels for phase difference detection, to have a high refraction index higher than those of the first lenses L1 and L3. Thus, it is possible to block a crosstalk path by reflecting the incident light (LT1) and increase light gathering power of the incident light (LT1).

As each pixel becomes smaller in size, diffusion of incident light (LT1) gradually increases due to diffraction of light, such that light beams other than the incident light (LT1) may be introduced into the first pixels P1 and P4 that are adjacent to the second pixels P2 and P3 corresponding to target pixels. When the second lens L2 shown in FIG. 6 is formed to have the same refractive index as those of the first lenses L1 and L3 without being formed as a high-refractive-index lens, light beams other than the incident light (LT1) incident upon the second pixels P2 and P3 may be introduced into the first pixels P1 and P4 that are adjacent to the second pixels P2 and P3. Some implementations of the disclosed technology provide the second lens L2 formed as a high-refractive-index lens to have a higher refractive index than the first lenses L1 and L3. With the second lens L2 having a higher refractive index than those of the first lenses L1 and L2, it is possible to prevent diffracted light other than the chief ray incident upon the second pixels P2 and P3 from being introduced into the first pixels P1 and P4 that are adjacent to the second pixels P2 and P3.

The optical filters 114a~114c contained in the unit pixel array P_CR_1 may be arranged to correspond to the pixels P1~P4 arranged in a matrix array including a plurality of rows and a plurality of columns, resulting in formation of an optical filter array. The optical filters 114a~114c may be formed between the optical grid structures 115a~115d adjacent to each other at an upper portion of the substrate 118. The optical filters 114a~114c may selectively transmit light (e.g., red light, green light, blue light, magenta light, yellow light, cyan light, infrared (IR) light, or others) having a transmission wavelength band. The transmission wavelength band may refer to a wavelength band of light to be selectively transmitted by the corresponding optical filter. For example, each of the optical filters 114a~114c may include a colored photosensitive material corresponding to a specific color, or may include thin film layers that are alternately arranged.

In some implementations, the optical filter 114a included in the first pixel P1 may absorb or transmit red light, and the optical filter 114c included in the first pixel P4 may absorb or transmit green light. The optical filter 114b included in the second pixels P2 and P3 may absorb or transmit green light. In some implementations, the second pixels P2 and P3 sharing the second lens L2 may include the optical filter 114b having the same color. The color of the optical filter 114b included in the second pixels P2 and P3 shown in FIG. 6 can be modified in various manners.

The optical grid structures 115a~115d may prevent light incident upon the optical filters 114a~114c from moving to adjacent pixels, thereby minimizing optical crosstalk between the adjacent pixels. The optical grid structures 115a~115d may be formed between the optical filters 114a~114c. The second pixels P2 and P3 corresponding to two pixels may include the optical filter 114b having the same color and only one second lens L2. Therefore, the optical grid structure may not be formed in the optical filter 114b including the second lens L2.

The planarization layer 116 may be formed between the substrate 118 and the optical filters 114a~114c. The planarization layer 116 may prevent incident light from being reflected from the first lenses L1 and L3, the second lens L2, and the optical filters 114a~114c.

The substrate 118 may include a top surface and a bottom surface facing away from each other. The bottom surface of the substrate 118 may be defined as a front side, and the top surface of the substrate 118 may be defined as a back side, without being limited thereto. For example, the substrate 118 may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate.

The substrate 118 may include unit pixels that convert incident light into photocharges to generate electrical signals corresponding to the photocharges. To this end, each of the unit pixels may include a photoelectric conversion element 119 and a plurality of transistors (not shown).

The photoelectric conversion elements 119a~119d may be respectively disposed in the pixels P1~P4, and may generate and accumulate photocharges corresponding to intensity of light.

Each of the photoelectric conversion elements 119a~119d may also be implemented as a photodiode, a phototransistor, a photogate, a pinned photodiode or a combination thereof. If each of the photoelectric conversion elements 119a~119d is implemented as a photodiode, each of the photoelectric conversion elements 119a~119d may be formed as an N-type doped region through ion implantation of N-type ions. In some implementations, each of the photoelectric conversion elements 119a~119d may be formed by stacking a plurality of doped regions. In this case, a lower doped region may be formed by implantation of N$^+$ ions, and an upper doped region may be formed by implantation of N$^-$ ions. The photoelectric conversion elements 119a~119d may be arranged across as large a region as possible to increase a fill factor indicating light reception (Rx) efficiency.

Photocharges accumulated in the photoelectric conversion elements 119a~119d may be converted into pixel signals through a readout circuit coupled to the photoelectric conversion elements 119a~119d, such that the pixel signals can be output to column lines. In some implementations, assuming that each unit pixel of the CMOS image sensor includes a 4-transistor (4T) structure, the readout circuit may include a floating diffusion (FD) node, a transfer transistor, a reset transistor, a source follower transistor, and a selection transistor.

In some implementations, the floating diffusion (FD) node may refer to a region that receives photocharges from the photoelectric conversion elements 119a~119d and accumulates the received photocharges therein. The transfer transistor may transmit the photocharges accumulated in the photoelectric conversion elements 119a~119d to the floating diffusion (FD) node in response to a transmission (Tx) signal received from the row driver 120. The reset transistor may reset the floating diffusion (FD) node to a reset voltage (e.g., a power-supply voltage) in response to a pixel reset signal received from the row driver 120. The source follower transistor may convert a potential of the floating diffusion (FD) node connected to a gate terminal thereof into an electrical signal, and may output the electrical signal to the selection transistor. The selection transistor may transmit the electrical signal received from the source follower transistor to the column line in response to a row selection signal received from the row driver 120. Here, the electrical signal transmitted to the column line by the selection transistor may serve as a pixel signal.

In some implementations, device isolation layers 117a~117e may be formed between the photoelectric conversion elements 119a~119d of the contiguous or adjacent pixels, such that the device isolation layers 117a~117e can electrically or optically isolate the contiguous or adjacent pixels that are located adjacent to each other. The device isolation layers 117a~117e may be formed to be deeply etched in a vertical direction through a trench process at right and left sides of the photoelectric conversion elements 119a~119d, resulting in formation of a deep trench isolation (DTI) structure.

As described above, the second lens L2 corresponding to the second pixels P2 and P3 for phase difference detection may be formed as a high-refractive-index lens having a high refractive index, such that the second lens L2 can minimize the amount of light transmission to the adjacent pixels, resulting in reduction in crosstalk.

Figure 7:
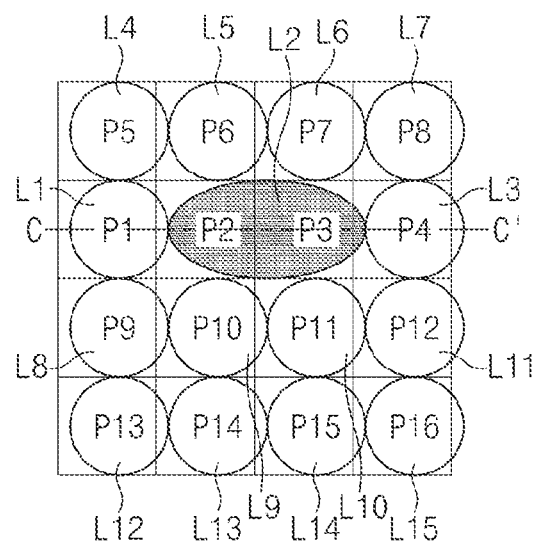
FIGS. 7 and 8 are plan views illustrating other examples of the unit pixel array shown in FIG. 2 based on some implementations of the disclosed technology.
Figure 8:
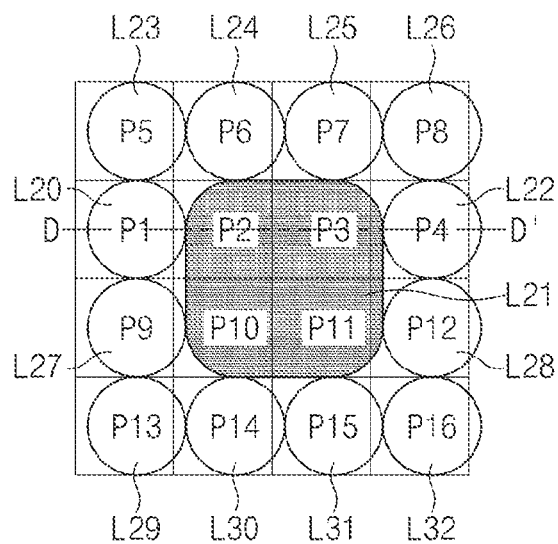

FIGS. 7 and 8 are plan views illustrating examples of the unit pixel arrays P_ER1_1 and P_ER1_2 disposed in the edge region ER1 of the pixel array 110 shown in FIG. 2.

The pixels P1~P16 of the unit pixel arrays P_ER1_1 and P_ER1_2 shown in FIGS. 7 and 8 are identical in structure to those of FIGS. 4 and 5, and thus the redundant description thereof will herein be omitted. Although FIGS. 7 and 8 exemplarily illustrate the edge region ER1, other implementations are also possible. The other edge region ER2 is arranged symmetrical to the edge region ER1 based on the optical axis (OA), and as such a detailed description thereof will herein be omitted for convenience of description.

In FIG. 7, the first lenses (L1, L3~L15) and the second lens L2 included in the unit pixel array P_ER1_1 may be shifted to the right side with respect to the center line of each of the pixels P1~P16. For example, the second lens L2 may be shifted to the right side based on the position of the second pixels P2 and P3, such that a portion of the right side of the second lens L2 may be arranged to overlap with some parts of the pixel P4.

In FIG. 8, the first lenses (L20, L22~L32) and the second lens L21 included in the unit pixel array P_ER1_2 may be shifted to the right side with respect to the center line of each of the pixels P1~P16. For example, the second lens L21 may be shifted to the right side based on the position of the unit pixels P2, P3, P10, and P11, such that a portion of the right side of the second lens L21 may be arranged to overlap with some parts of the pixels P4 and P12.

Figure 9:
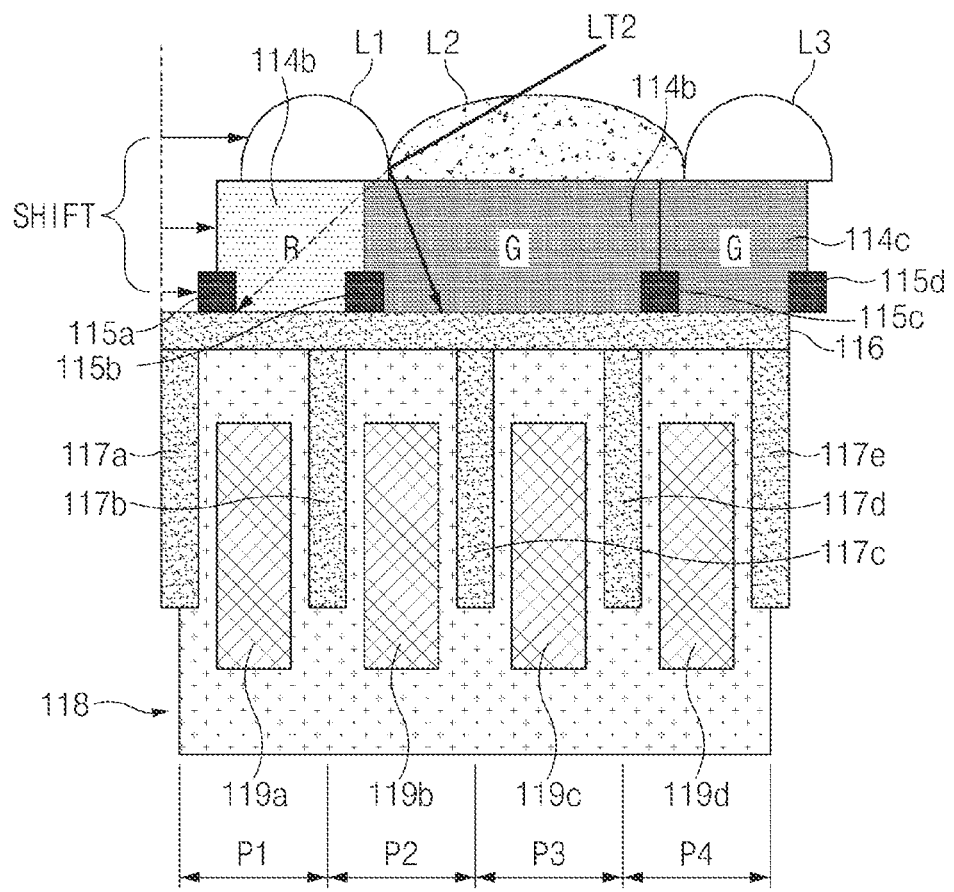
FIG. 9 is a cross-sectional view illustrating an example of a pixel array shown in FIG. 7 based on some implementations of the disclosed technology.

FIG. 9 is a cross-sectional view illustrating the unit pixel array P_ER1_1 shown in FIG. 7 based on some implementations of the disclosed technology. The same cross-sectional view can be also obtained from the pixel array P_ER1_2 by taking along the line D-D' shown in FIG. 8. Referring to FIG. 9, the cross-sectional view includes the first lenses L1 and L3 of the pixels P1 and P4 and the second lens L2 of the pixels P2 and P3.

The constituent elements included in the pixels P1, P2, P3, and P4 of the unit pixel array P_ER1_1 have already been described with reference to FIG. 6. For convenience of description, the pixels P1, P2, P3, and P4 of the unit pixel array P_ER1_1 shown in FIG. 9 will hereinafter be described by focusing on characteristics different from those of FIG. 6.

Referring to FIG. 9, in order to improve shading variations in the edge region ER1, the optical grid structures 115a~115d, the optical filters 114a~114c, and the lenses L1~L3 may be shifted to the right horizontal direction with regard to the center axis of each of the photoelectric conversion elements 119a~119d. Thus, the optical grid structures 115a~115d, the optical filters 114a~114c, and the lenses L1~L3 may not be aligned with the photoelectric conversion elements 119a~119d, and may be shifted toward the center (e.g., toward the optical axis (OA)) of the pixel array 110 along the right horizontal direction by a predetermined interval corresponding to the chief ray angle (CRA) of the corresponding unit pixels P1~P4. In some implementations, the optical grid structures 115a~115d, the optical filters 114a~114c, and the lenses L1~L3 are disposed to be shifted toward one side (e.g., right side in the example as shown in FIGS. 7-9) with respect to a center of the substrate.

The degree of such shifting in the optical grid structures 115a~115d, the degree of such shifting in the optical filters 114a~114c, and the degree of such shifting in the lenses L1~L3 may be different from each other. As can be seen from FIG. 9, the degree of shifting in the optical filters 114a~114c may be greater than those of the optical grid structures 115a~115d. In some implementations, the optical filters 114a~114c may be shifted more than the optical grid structures 115a~115d. In some implementations, the degree of shifting in the lenses L1~L3 may be greater than those of the optical filters 114a~114c. In some implementations, the lenses L1~L3 may be shifted more than the optical filters 114a~114c.

In the edge region ER1, incident light (LT2) to be incident upon the pixels P1~P4 may be obliquely incident upon a top surface of the substrate 118. The incident light (LT2) can be incident toward the left side based on the center line of the lenses L1~L3 of the pixels P1~P4, such that the incident light (LT2) can be more effectively focused and filtered.

In the edge region ER1, the optical grid structures 115a~115d, the optical filters 114a~114c, and the lenses L1~L3 may be shifted in the central direction (i.e., the optical axis (OA) direction) of the pixel array 110, such that they can receive some light beams having a small CRA (Chief Ray Angle) value from among all light beams refracted by the lens module (LM). Accordingly, the unit pixel array P_ER1_1 disposed in the edge region ER1 may receive light beams having a small CRA value. As a result, the unit pixel array P_ER1_1 can optimize the amount of light reception even in the edge region ER1 of the pixel array 110.

As each pixel becomes smaller in size, diffusion of incident light (LT2) gradually increases due to diffraction of light, such that light beams other than the incident light (LT2) can be introduced into the first pixel P1 adjacent to the second pixels P2 and P3 corresponding to target pixels. When the second lens L2 shown in FIG. 9 is formed to have the same refractive index as those of the first lenses L1 and L3 without being formed as a high-refractive-index lens, the incident light (LT2) incident upon the second pixels P2 and P3 can be introduced into the first pixel P1 adjacent to the second pixels P2 and P3 without being refracted toward the second pixels P2 and P3, as represented by dotted lines. As a result, optical crosstalk that causes reduction of a signal-to-noise ratio (SNR) may occur.

Some implementations of the disclosed technology provide the second lens L2 formed as a high-refractive-index lens that has a higher refractive index than the first lenses L1 and L3. Thus, the incident light (LT2) to be incident upon the second pixels P2 and P3 may be reflected from the second pixels P2 and P3 as represented by solid lines and the incident light (LT2) may not be introduced into the first pixel P1 adjacent to the second pixels P2 and P3. As described above, the image sensing device based on some implementations of the disclosed technology may allow the second lens L2 corresponding to the second pixels P2 and P3 for phase difference detection to be formed as a high-refractive-index lens, such that the second lens L2 can minimize the amount of light transmission to the adjacent pixels, resulting in reduction in crosstalk.

As is apparent from the above description, the image sensing device based on some implementations of the disclosed technology can effectively prevent crosstalk from being introduced into adjacent pixels.

Only a few examples of embodiments are described for implementing the disclosed technology. Variations and enhancements of the disclosed embodiments and other embodiments can be made based on what is disclosed and/or illustrated in this patent document.

What is claimed is:

1. An image sensing device, comprising:
 a substrate including a plurality of photoelectric conversion elements, each of which generates and accumulates photocharges corresponding to incident light; and
 a first lens and a second lens disposed over the substrate, and arranged to receive the incident light and to direct received incident light to the plurality of photoelectric conversion elements,
 wherein the first lens and the second lens have different refractive indices from each other,
 wherein the first lens and the second lens are disposed to be in contact with each other in a first direction and define a side boundary surface that is between the first lens and the second lens and extends in a direction perpendicular to the first direction.

2. The image sensing device according to claim 1, wherein:
 the first lens is disposed over a photoelectric conversion element included in a first pixel configured to detect an image; and
 the second lens is disposed over photoelectric conversion elements included in second pixels configured to perform an autofocus operation.

3. The image sensing device according to claim 2, wherein:
 the second lens is disposed over two photoelectric conversion elements included in two pixels.

4. The image sensing device according to claim 2, wherein:
 the second lens is disposed over four photoelectric conversion elements included in four pixels.

5. The image sensing device according to claim 1, further including:
 a plurality of optical filters disposed between the substrate and the first lens and the second lens;
 a plurality of optical grid structures disposed between two adjacent optical filters and configured to prevent incident light applied to the optical filters from entering to adjacent pixels; and
 a planarization layer disposed between the substrate and the optical filters and configured to prevent reflection of the incident light.

6. The image sensing device according to claim 5, wherein:

the first lens and the second lens are arranged to be shifted in a predetermined direction with respect to a center of the substrate.

7. The image sensing device according to claim 2, wherein the second pixels correspond to phase detection autofocus (PDAF) pixels.

8. The image sensing device according to claim 2, wherein the second pixel is disposed in a central region of a pixel array and the first pixel is disposed in an edge region of the pixel array that surrounds the central region.

9. The image sensing device according to claim 1, wherein the first lens and the second lens have different sizes from each other.

10. An image sensing device, comprising:
    a first pixel array disposed in an edge region of a pixel array; and
    a second pixel array disposed in a central region of the pixel array that is surrounded by the edge region,
    wherein the first pixel array includes first pixels configured to detect an image and the second pixel array includes second pixels configured to detect a phase difference between images,
    wherein a first lens having a first refractive index is disposed to correspond to each of the first pixels; and
    a second lens having a second refractive index higher than the first refractive index is disposed to correspond some of the second pixels,
    wherein the first lens and the second lens are disposed to be in contact with each other in a first direction and define a side boundary surface that is between the first lens and the second lens and extends in a direction perpendicular to the first direction.

11. The image sensing device of claim 10, wherein the second pixels correspond to phase detection autofocus (PDAF) pixels.

12. The image sensing device of claim 10, wherein each of a first pixel and a second pixel in the first pixel array and the second pixel array includes a photoelectric conversion element configured to generate and accumulate photocharges corresponding to intensity of light.

13. The image sensing device of claim 12, wherein the first lens of the first pixel in the first pixel array is disposed to be aligned with the photoelectric conversion element of the first pixel.

14. The image sensing device according to claim 12, wherein:
    the first lens of the first pixel in the first pixel array is shifted in a predetermined direction with respect to the photoelectric conversion element of the first pixel.

15. The image sensing device according to claim 10, wherein the second lens in the first pixel array and the second pixel array has a size greater than that of the first lens in the first pixel array and the second pixel array.

16. The image sensing device according to claim 12, further including a plurality of device isolation layers disposed between photoelectric conversion elements.

17. The image sensing device according to claim 10, wherein each of the first pixel array and the second pixel array further includes:
    a plurality of optical filters disposed between a substrate and the first lens and between the substrate and the second lens; and
    a plurality of optical grid structures disposed between two adjacent optical filters and configured to prevent incident light applied to the optical filters from moving to adjacent pixels.

18. The image sensing device according to claim 17, wherein:
    each of the plurality of optical grid structures is shifted in a predetermined direction with respect to a position of a corresponding photoelectric conversion element.

19. The image sensing device according to claim 18, wherein:
    each of the optical filters are shifted in a predetermined direction with respect to a position of a corresponding photoelectrical conversion element.

* * * * *